(12) United States Patent
Sutoh

(10) Patent No.: US 11,551,988 B2
(45) Date of Patent: *Jan. 10, 2023

(54) ELECTRONIC COMPONENT OR PRECURSOR THEREOF, AND METHOD FOR MANUFACTURING SAME

(71) Applicant: DOW TORAY CO., LTD., Tokyo (JP)

(72) Inventor: Manabu Sutoh, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 301 days.

This patent is subject to a terminal disclaimer.

(21) Appl. No.: 16/647,008

(22) PCT Filed: Sep. 11, 2018

(86) PCT No.: PCT/JP2018/033633
§ 371 (c)(1),
(2) Date: Mar. 12, 2020

(87) PCT Pub. No.: WO2019/054371
PCT Pub. Date: Mar. 21, 2019

(65) Prior Publication Data
US 2021/0225720 A1    Jul. 22, 2021

(30) Foreign Application Priority Data
Sep. 15, 2017    (JP) .............................. JP2017-177541

(51) Int. Cl.
*H01L 23/29*    (2006.01)
*H01L 23/31*    (2006.01)
(Continued)

(52) U.S. Cl.
CPC .............. *H01L 23/296* (2013.01); *B05D 1/26* (2013.01); *C08G 77/12* (2013.01); *C08L 83/04* (2013.01); *H01L 23/31* (2013.01)

(58) Field of Classification Search
CPC ....... H01L 23/296; H01L 23/31; C08G 77/12; C08L 83/04
See application file for complete search history.

(56) References Cited

U.S. PATENT DOCUMENTS

| 2010/0276721 A1 | 11/2010 | Yoshitake et al. |
| 2011/0245426 A1 | 10/2011 | Nabeta et al. |

(Continued)

FOREIGN PATENT DOCUMENTS

| EP | 2612887 A1 | 7/2013 |
| JP | 2008222828 A | 9/2008 |

(Continued)

OTHER PUBLICATIONS

Van Krevelen (Properties of Polymers, Elsveier Scientific Publishing Co., 1976, p. 348-349) (Year: 1976).*

(Continued)

*Primary Examiner* — Eugene Lee
(74) *Attorney, Agent, or Firm* — Warner Norcross + Judd LLP

(57) ABSTRACT

An electronic component, or a precursor thereof, that comprises a curable organopolysiloxane composition or a cured product thereof is disclosed. The curable organopolysiloxane composition is generally curable through a hydrosilylation reaction and can be applied to at least one area by a microdroplet application device. The curable organopolysiloxane composition has a viscosity of no more than 2.0 Pa·s at a strain rate of 1,000 (1/s), and a viscosity at a strain rate of 0.1 (1/s) being a value no less than 50.0 times the viscosity at a strain rate of 1,000 (1/s). In particular, the area of application generally is a substantially circular area that fits within a frame no more than 1000 μm in diameter, a linear area no more than 1000 μm in line width, or a pattern configured from a combination of these areas.

10 Claims, 1 Drawing Sheet

(51) Int. Cl.
    *B05D 1/26* (2006.01)
    *C08G 77/12* (2006.01)
    *C08L 83/04* (2006.01)

(56) References Cited

U.S. PATENT DOCUMENTS

| | | | |
|---|---|---|---|
| 2012/0125436 A1* | 5/2012 | Cummings | H01L 23/3737 |
| | | | 165/185 |
| 2013/0092423 A1 | 4/2013 | Hamada et al. | |
| 2013/0248163 A1 | 9/2013 | Bhagwagar et al. | |
| 2013/0256741 A1 | 10/2013 | Harkness et al. | |
| 2014/0315032 A1 | 10/2014 | Bebenroth et al. | |
| 2015/0200317 A1 | 7/2015 | Kretschmann et al. | |
| 2015/0210853 A1* | 7/2015 | Fujisawa | C08L 83/04 |
| | | | 524/494 |
| 2017/0121462 A1 | 5/2017 | Fujisawa et al. | |
| 2017/0130006 A1* | 5/2017 | Saito | C08G 59/00 |
| 2018/0179384 A1* | 6/2018 | Matsumoto | C08L 83/04 |
| 2020/0270500 A1* | 8/2020 | Ota | H01M 10/613 |
| 2020/0277493 A1* | 9/2020 | Sutoh | C08K 3/36 |
| 2020/0407600 A1* | 12/2020 | Swier | C08G 77/442 |

FOREIGN PATENT DOCUMENTS

| | | |
|---|---|---|
| JP | 2010106223 A | 5/2010 |
| JP | 2013089619 A | 5/2013 |
| JP | 2013100464 A | 5/2013 |
| JP | 2013100516 A | 5/2013 |
| JP | 2013253210 A | 12/2013 |
| JP | 2014503680 A | 2/2014 |
| JP | 2014506263 A | 3/2014 |
| JP | 2014210851 A | 11/2014 |
| JP | 2015091576 A | 5/2015 |
| JP | 2015530940 A | 10/2015 |
| WO | 2015155950 A1 | 10/2015 |

OTHER PUBLICATIONS

Machine assisted English translation of JP2013253210A obtained from https://patents.google.com/patent on Mar. 12, 2020, 29 pages.
English translation of International Search Report for PCT/JP2018/033633 dated Dec. 11, 2018, 2 pages.
Machine assisted English translation of JP2008222828A obtained from https://patents.google.com/patent on Mar. 12, 2020, 9 pages.
Machine assisted English translation of JP2013100464A obtained from https://patents.google.com/patent on Mar. 12, 2020, 10 pages.
Machine assisted English translation of JP2014210851A obtained from https://patents.google.com/patent on Mar. 12, 2020, 10 pages.
Machine assisted English translation of JP2015091576A obtained from https://patents.google.com/patent on Mar. 12, 2020, 14 pages.

* cited by examiner

[FIG. 1]
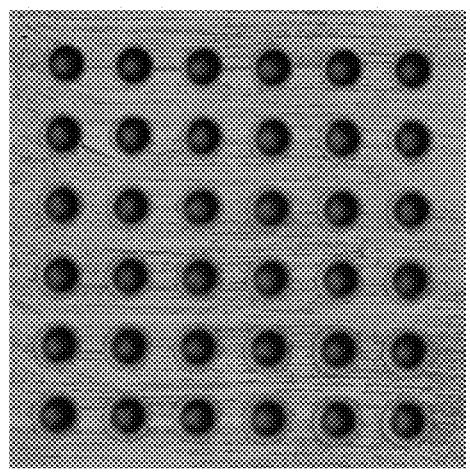
[FIG. 2]
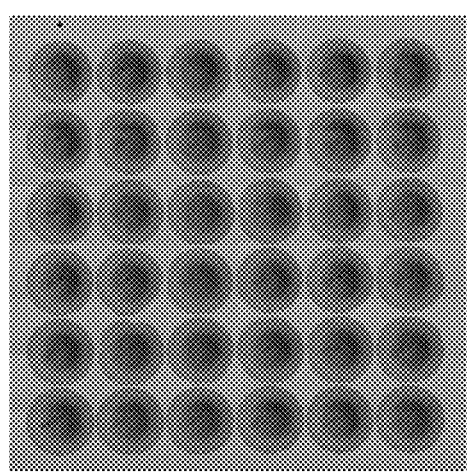
[FIG. 3]
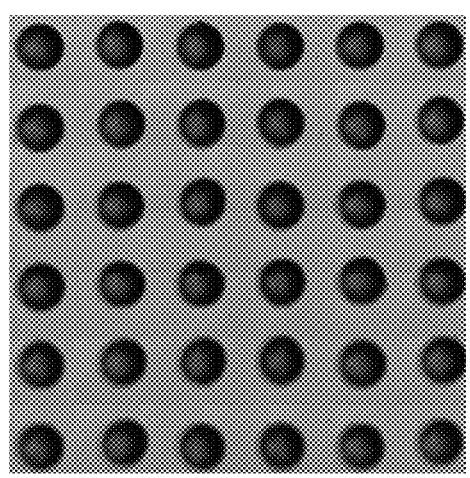

ELECTRONIC COMPONENT OR PRECURSOR THEREOF, AND METHOD FOR MANUFACTURING SAME

CROSS-REFERENCE TO RELATED APPLICATIONS

This application is the National Stage of International Appl. No. PCT/JP2018/033633 filed on 11 Sep. 2018, which claims priority to and all advantages of Japanese Appl. No. 2017-177541 filed on 15 Sep. 2017, the content of which is hereby incorporated by reference.

TECHNICAL FIELD

The present invention relates to an electronic component or precursor thereof comprising a curable organopolysiloxane composition or cured product thereof applied using a microdroplet application device such as a jet dispenser. The present invention also relates to a method for manufacturing this electronic component or precursor thereof.

BACKGROUND ART

Curable organopolysiloxane compositions are widely used as protective or adhesive compositions in electric and electronic components and to fill and seal spaces in mobile phones and image displaying devices such as touch panels, thereby increasing reliability and improving durability. One-part curable organopolysiloxane compositions curing using a hydrosilylation reaction have especially good handling and workability and cure rates, produce cured products with excellent heat resistance, and confer advantages over other materials in that substrate adhesion and the hardness of the cured product can be controlled as desired.

As electric and electronic components become smaller and more precise, there is greater demand for electronic components on substrates for electronic materials and image display devices in which micropatterns have been formed with organopolysiloxane compositions. Because these patterns have designs in which each application area is a substantially dot-shaped area with a diameter of 1 mm or less or a linear area with a width of 1 mm or less, and very large numbers of these application areas are arranged with great precision, these compositions are preferably applied by a microdroplet application device using the inkjet or dispenser application method during industrial production.

However, existing curable organopolysiloxane compositions are liquids. When these are applied using a microdroplet application device such as a microdroplet application device with micronozzles of 1000 µm or less, the liquid scatters or spreads (flows) beyond the target range for the application areas and a micropattern becomes difficult to form. The same compositions can be designed with higher viscosity in order to reduce fluidity and more precisely apply droplets with less scattering, but when higher viscosity compositions are designed to prevent scattering of droplets, the higher viscosity causes nozzles to become clogged and increases the amount of composition applied per dot. Compositions with higher viscosity are also difficult to apply using a microdroplet application device such as a jet dispenser. A curing reaction is also more likely to occur inside the nozzles and nozzles are more likely to become clogged.

In order to solve this problem, a simple pattern forming method has been proposed in Patent Document 1 which uses a curable organopolysiloxane composition with fast curing properties obtained by applying two types of curable organopolysiloxanes that react when mixed together separately from two different nozzles so that they mix together on a substrate. However, this method requires a microdroplet application device with nozzles that can accommodate a two-part composition. Multiple-part liquid application and separate part liquid application depend substantially on physical contact between two liquids on the substrate. Therefore, work efficiency and precision application properties are often inadequate, and curing properties and cured product properties premised on the perfect mixing together of both liquids often cannot be achieved, especially in the case of curing properties. From the standpoint of work efficiency, precision application, and cured product properties, there is strong demand for a one-part curable organopolysiloxane composition suitable for precise application using a microdroplet application device such as a jet dispenser and for micropattern formation.

Compact, highly integrated MEMS devices using MEMS (microelectromechanical systems) technologies such as sensors have recently become popular in the field of semiconductor devices. Semiconductor chips obtained by miniaturization and dicing of the lead frame substrate of the semiconductor have also become smaller and lighter than ever. Therefore, there is strong demand for electronic components and precursors thereof obtained by precision application and micropattern formation of curable organopolysiloxanes or cured products thereof.

PRIOR ART DOCUMENTS

Patent Documents

Patent Document 1: JP 2015-091576 A

SUMMARY OF THE INVENTION

Problem to be Solved by the Invention

It is an object of the present invention to solve the problem described above by providing an electronic component or precursor thereof comprising a one-part curable organopolysiloxane composition or cured product thereof that can be used for precise application by a microdroplet application device such as a jet dispenser and for micropattern formation. It is another object of the present invention to provide an industrial scale manufacturing method for this electronic component or precursor thereof using a microdroplet application device such as a jet dispenser.

Means for Solving the Problem

As a result of extensive research, the present inventors discovered that the problem described above could be solved by focusing on rheological properties of a composition to provide an electronic component or precursor thereof comprising a curable organopolysiloxane composition whose viscosity and fluidity change significantly from high to low shear ranges. The present invention is a product of this discovery. Specifically, the fluidity of the composition increases when shear is applied to jet the composition from a microdroplet application device, making smooth ejection from the nozzles possible. However, once the composition has been jetted from the nozzles and the shear applied to jet the composition has been released, the fluidity of the composition decreases significantly and it becomes more viscous. By applying such a curable organopolysiloxane composition or cured product thereof that does not scatter or spread (flow) beyond the pinpoint application areas using a microdroplet application device such as a jet dispenser, an electronic component or precursor thereof can be obtained that can be applied with precision to form a micropattern and the problem described above can be solved.

More specifically, the object of the present invention is achieved by an electronic component or precursor thereof, characterized by comprising a curable organopolysiloxane composition or a cured product thereof, the curable organopolysiloxane composition having a viscosity of no more than 2.0 Pa·s at a strain rate of 1,000 (1/s) and a viscosity at a strain rate of 0.1 (1/s) of no less than 50.0 times the viscosity at a strain rate of 1,000 (1/s). In this composition, the viscosity at a strain rate of 1,000 (1/s) is preferably 1.5 Pa·s or less and the viscosity at a strain rate of 0.1 (1/s) is at least 50 Pa·s. The viscosity at a strain rate of 0.1 (1/s) may be at least 75.0 times or at least 100.0 times the viscosity at a strain rate of 1,000 (1/s).

Here, the viscosity at each strain rate can be measured using any method common in the art. For example, it can be measured under the conditions described below using an MCR-102 rheometer from Anton Paar.
Geometry: 20 mm diameter, 2-degree cone
Pre-shear: 10 (1/s), 60 s
Temperature: 25° C. constant
Equilibration time (stop time after pre-shear): 60 s
Strain rate dispersion: 0.05 (1/s) to 5000 (1/s)
Rate of increase in strain rate: 120 s/decade There are no particular restrictions on the curable organopolysiloxane composition used in the electronic component or precursor thereof in terms of the curing system, but it preferably contains at least one hydrosilylation-reactive organopolysiloxane. The curable organopolysiloxane composition may comprise:
(A) an alkenyl group-containing organopolysiloxane having a viscosity at 25° C. of from 10 to 100,000 mPa·s in an amount of 100 parts by mass;
(B) an organohydrogenpolysiloxane in an amount such that there are from 0.2 to 5 mol silicon-bonded hydrogen atoms in component (B) per mol of alkenyl groups in component (A);
(C) a hydrosilylation reaction catalyst in a catalytic amount;
(D) a functional filler with an average particle size of from 0.01 to 10 μm as measured by a laser diffraction/scattering method in an amount of from 2.5 to 20.0 parts by mass;
(E) one or more types of adhesion promoter;
(F) a hydrosilylation reaction inhibitor; and optionally
(G) a heat resistance imparting agent.

From the standpoint of high viscosity and low fluidity in the low strain rate range, component (D) may have at least (D1) a reinforcing filler with an average primary particle size in a range from 0.01 to 0.5 μm. From the standpoint of preventing nozzle clogging, component (F) may be a mixture of (F1) an acetylene-based hydrosilylation inhibitor and (F2) a cycloalkenylsiloxane-based hydrosilylation reaction inhibitor.

The curable organopolysiloxane composition used in the electronic component or precursor thereof is preferably a one-part composition. Preferably, the application area for the curable organopolysiloxane composition or cured product thereof is a substantially circular area fitting within a frame having a diameter of 1000 μm or less, a linear area having a line width of 1000 μm or less, or a pattern composed of a combination of these areas. By selecting a microdroplet application device and jetting conditions, the application area of the composition constituting the pattern (application area) is more preferably a substantially circular area fitting within a frame having a diameter of from 5 to 800 μm, a linear area having a line width of from 5 to 800 μm, or a pattern composed of a combination of these areas.

The application area for the curable organopolysiloxane composition or cured product thereof is preferably an application area using a jet dispenser. The jet dispenser preferably has jet ports with a nozzle diameter of from 50 to 200 μm.

The application area for the curable organopolysiloxane composition or cured product thereof is preferably formed for one or more purposes selected from among protecting, sealing or coating an electronic component or precursor thereof. For example, specific applications include protecting semiconductor chips, electrodes or wiring, sealing semiconductor chips or electrodes, sealing spaces and gaps between electronic components, and coating any of these elements. It is preferably used to provide protection, sealing or coating using a micropattern.

As for the electronic component or precursor thereof, the electronic component may be a semiconductor device or a MEMS device.

It is another object of the present invention to provide a method for manufacturing an electronic component or precursor thereof, the method comprising at least a step of applying this curable organopolysiloxane composition on a semiconductor substrate using a microdroplet application device. Here, the application area for the curable organopolysiloxane composition using a microdroplet application device is preferably a substantially circular area fitting within a frame having a diameter of 800 μm or less, a linear area having a line width of 800 μm or less, or a pattern composed of a combination of these areas, and the microdroplet application device is preferably a jet dispenser having jet ports with a nozzle diameter of from 50 to 200 μm.

Effects of the Invention

The present invention is able to provide an electronic component or precursor thereof comprising a one-part curable organopolysiloxane composition or cured product thereof that can be used for precise application by a microdroplet application device such as a jet dispenser and for micropattern formation. The present invention is also able to provide an industrial scale manufacturing method for this electronic component or precursor thereof using a microdroplet application device such as a jet dispenser.

BRIEF DESCRIPTION OF THE DRAWINGS

FIG. 1 shows a semiconductor substrate (20 mm×20 mm silicon chip) on which a low-volume precision pattern has been formed by a jet dispenser using the curable organopolysiloxane composition in Example 1.

FIG. 2 shows the results from applying the curable organopolysiloxane composition in Comparative Example 1 on a 20 mm×20 mm silicon chip using a jet dispenser in which the composition spread beyond the application diameters and precise application was not achieved.

FIG. 3 shows the results from applying the curable organopolysiloxane composition in Comparative Example 2 on a 20 mm×20 mm silicon chip using a jet dispenser in which a large amount of composition was applied, the composition spread beyond the application diameters, and less precise application than in Example 1 (FIG. 1) was achieved.

EMBODIMENT OF THE INVENTION

[Curable Organopolysiloxane Composition]

A curable organopolysiloxane composition of the present invention has macroscopic rheological properties in which the fluidity of the composition increases when shear is applied to jet the composition from a microdroplet application device, making smooth ejection from the nozzles possible, and in which the fluidity of the composition decreases significantly and it becomes more viscous once the composition has been jetted from the nozzles and the shear applied to jet the composition has been released. In other words, the composition can be jetted smoothly using a microdroplet application device and forms highly viscous droplets due to a rapid loss of liquidity from jetting to application on the substrate, keeping the composition from scattering or spreading (flowing) beyond the target pinpoint application areas.

More specifically, a curable organopolysiloxane composition of the present invention is characterized by a viscosity that changes depending on the strain rate (1/s), the viscosity at a strain rate of 1,000 (1/s) being 2.0 Pa·s or less and the viscosity at a strain rate of 0.1 (1/s) being at least 50.0 times the viscosity at a strain rate of 1,000 (1/s). This significant change in viscosity is in response to a significant change in the fluidity of the composition from a high shear range to a low shear range. Preferably, the viscosity at a strain rate of 0.1 (1/s) may be at least 75.0 times or at least 100.0 times the viscosity at a strain rate of 1,000 (1/s).

From the standpoint of jetting properties from a microdroplet application device such as a jet dispenser and precision application, the viscosity of the composition at a strain rate of 1,000 (1/s) is preferably 1.5 Pa·s or less and the viscosity at a strain rate of 0.1 (1/s) is at least 50 Pa·s. A lower viscosity at a strain rate of 1,000 (1/s) means easier jetting from a jet dispenser and a lower likelihood of nozzle clogging. Therefore, a viscosity at a strain rate of 1,000 (1/s) in a range from 0.30 to 1.50 Pa·s or in a range from 0.50 to 1.40 Pa·s is preferred. A higher viscosity at a strain rate of 0.1 (1/s) means a lower likelihood of the composition scattering or spreading (flowing) beyond the target pinpoint application areas. Therefore, the viscosity at a strain rate of 0.1 (1/s), in a range from 50.0 to 500.0 Pa·s or in a range from 55.0 to 300.0 Pa·s or in a range from 55.0 to 275.0 Pa·s is preferred, assuming it is at least 50.0 times the viscosity at a strain rate of 1,000 (1/s).

These properties reflect a curable organopolysiloxane composition of the present invention having thixotropic properties. Among these properties, the viscosity of the composition in the high shear range can be established primarily by the selection of the polymer component (organopolysiloxane), and the viscosity of the composition in the low shear range can be established primarily by the selection of the filler. There are no particular restrictions on the constituent components, curing system, or types of organopolysiloxane and filler used as long as the curable organopolysiloxane composition of the present invention satisfies the characteristics described above. The desired composition can be selected based on the characteristics of the cured product and its intended use.

There are no particular restrictions on the reaction system used by a curable organopolysiloxane composition of the present invention, but the composition preferably contains at least one type of functional group with curing reactivity in a hydrosilylation reaction, condensation reaction, radical reaction, or high energy beam reaction. From the standpoint of handling and workability and rapid curability, the composition preferably contains a functional group with hydrosilylation reactivity. If desired, the composition may also have a functional group with condensation reactivity or a functional group with high energy beam reactivity. This may be combined with a radical reaction using, for example, a peroxide.

Preferably, a curable organopolysiloxane composition of the present invention comprises:

(A) an alkenyl group-containing organopolysiloxane having a viscosity at 25° C. of from 10 to 100,000 mPa·s in an amount of 100 parts by mass;
(B) an organohydrogenpolysiloxane in an amount such that there are from 0.2 to 5 mol silicon-bonded hydrogen atoms in component (B) per mol of alkenyl groups in component (A);
(C) a hydrosilylation reaction catalyst in a catalytic amount;
(D) a functional filler with an average particle size of from 0.01 to 10 μm as measured by a laser diffraction/scattering method in an amount of from 2.5 to 20.0 parts by mass;
(E) one or more types of adhesion promoter;
(F) a hydrosilylation reaction inhibitor; and optionally
(G) a heat resistance imparting agent.

[(A) Alkenyl Group-Containing Organopolysiloxane]

The alkenyl group-containing organopolysiloxane in component (A) is the primary component in the composition and has a viscosity at 25° C. in a range from 10 to 100,000 mPa·s. Here, "viscosity at 25° C." means the kinematic viscosity of component (A) alone as measured using, for example, a rotational viscometer.

The viscosity at 25° C. of component (A) is preferably in a range from 10 to 100,000 mPa·s, and more preferably in a range from 10 to 10,000 mPa·s. When the viscosity of component (A) is less than 10 mPa·s, the viscosity of the composition at a strain rate of 0.1 (1/s) is too low and the rheological properties described above often cannot be realized. When the viscosity of component (A) at 25° C. is greater than 100,000 mPa·s, it can be difficult to design a composition with a viscosity at a strain rate of 1,000 (1/s) that is 2.0 Pa·s or less and the handling and workability and gap filling properties tend to decline.

Component (A) consists of one type or two or more types of alkenyl group-containing organopolysiloxane. There are no particular restrictions on the molecular structure of these alkenyl group-containing organopolysiloxanes, which may be linear, branched, cyclic, three-dimensionally reticulated, or any combination of these. Component (A) may consist solely of a linear alkenyl group-containing organopolysiloxane, solely of a branched alkenyl group-containing organopolysiloxane, or a mixture of a linear alkenyl group-containing organopolysiloxane and branched alkenyl group-containing organopolysiloxane. Examples of alkenyl groups in the molecule include a vinyl group, allyl group, butenyl group, and hexenyl group. Examples of organic groups other than alkenyl groups in component (A) include alkyl groups such as a methyl group, ethyl group, and propyl group; aryl groups such as a phenyl group and tolyl group; and monovalent hydrocarbon groups excluding halogenated alkyl groups such as a 3,3,3-trifluoropropyl group as well as other alkenyl groups.

A linear alkenyl group-containing organopolysiloxane as component (A) is especially preferred. Here, there are no particular restrictions on the alkenyl group binding site, which may be at the end of the molecular chain or bonded to a side chain via a silicon atom in the polysiloxane constituting the main chain. There may be an alkenyl group at both ends of the molecular chain or alkenyl groups only at both ends of the molecular chain. There are no particular restrictions on component (A). Examples include dimethylpolysiloxane capped at both ends of the molecular chain with a dimethylvinylsiloxy group, dimethylsiloxane/methylphenylsiloxane copolymers capped at both ends of the molecular chain with a dimethylvinylsiloxy group, dimethylsiloxane/methylvinylsiloxane copolymers capped at both ends of the molecular chain with a trimethylsiloxy group, dimethylsiloxane/methylvinylsiloxane/methylphenylsiloxane copolymers capped at both ends of the molecular chain with a trimethylsiloxy group, dimethylsiloxane/methylvinylsiloxane copolymers capped at both ends of the molecular chain with a silanol group, these polymers in which some of the methyl groups in the polymer have been substituted with an alkyl group other than a methyl group such as an ethyl group or a propyl group, or a halogenated alkyl group such as a 3,3,3-trifluoropropyl group, these polymers in which some of the vinyl groups in the polymer have been substituted with an alkenyl group other than a vinyl group such as an allyl group, butenyl group, and hexenyl group, and mixtures of two or more of these polymers. From the standpoint of preventing contact faults, low molecular weight siloxane oligomers (octamethyltetrasiloxane (D4) and decamethylpentasiloxane (D5)) are preferably reduced or eliminated from among these alkenyl group-containing organopolysiloxanes.

Component (A) in the present invention may have an alkoxysilyl-containing group bonded to a silicon atom represented by the following formula.

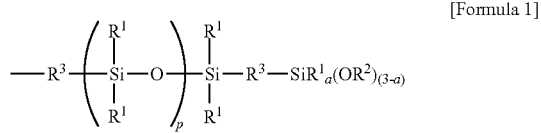

[Formula 1]

(In this formula, each $R^1$ is the same or different monovalent hydrocarbon group having no aliphatic unsaturated bond, $R^2$ is an alkyl group, each $R^3$ is the same or different alkylene group, a is an integer from 0 to 2, and p is an integer from 1 to 50.) Organopolysiloxanes with these functional groups hold down the viscosity of the composition in an uncured state, and function as a surface treatment agent for component (D) due to the alkoxysilyl group in the molecule. As a result, thickening and oil bleeding are suppressed in the resulting composition, and unhindered handling and workability may be obtained.

Component (A) may be added to the composition alone or kneaded together with component (D) below and added to the composition in the form of a master batch.

[(B) Organohydrogenpolysiloxane]

Component (B) is the primary crosslinking agent for a composition of the present invention. Organohydrogenpolysiloxanes having two or more silicon-bonded hydrogen atoms in the molecule can be used without any restrictions and are preferred. However, from the standpoint of the flexibility, a cured product obtained by curing a composition of the present invention, the structure of the organohydrogenpolysiloxane and the (average) number of silicon-bonded hydrogen atoms in the molecule can be designed. From the standpoint of excellent flexibility of the resulting organohydrogenpolysiloxane cured product, excellent releasability of the cured product from members, and improved repairability of the cured product for modification and reuse, a linear organohydrogenpolysiloxane having at least two of these atoms in a molecular side chain may be used as a chain extender. In order to obtain a cured product with a high degree of hardness, an organohydrogenpolysiloxane with a plurality of silicon-bonded hydrogen atoms in a side chain may be used as a crosslinking agent or combined with these.

[Amount of Organohydrogenpolysiloxane (Crosslinking Agent) in Composition]

As for component (B), in a composition of the present invention, the amount of silicon-bonded hydrogen atoms in component (B) has to be at least in a range from 0.2 to 50 mol or from 0.2 to 30 mol or from 0.2 to 10 mol or from 0.2 to 5 mol per mol of alkenyl groups in component (A).

Examples of component (B) include methyl hydrogen siloxane/dimethyl siloxane copolymers capped at both ends of the molecular chain with a trimethylsiloxy group, methyl hydrogen siloxane/dimethyl siloxane copolymers capped at both ends of the molecular chain with a dimethyl hydrogensiloxy group, methyl hydrogen polysiloxane capped at both ends of the molecular chain with a trimethylsiloxy group, dimethyl polysiloxane capped at both ends of the molecular chain with a dimethyl hydrogensiloxy group, methyl hydrogen siloxy group-containing siloxane resins, cyclic methyl hydrogen siloxane/dimethyl siloxane copolymers, and cyclic methyl hydrogen polysiloxanes. These examples are non-limiting, and some of the methyl groups may be substituted with an alkyl group having two or more carbon atoms, a phenyl group, a hydroxyl group, an alkoxy group, or a halogen-substituted alkyl group.

There are no particular restrictions, but the viscosity of component (B1) at 25° C. is preferably in a range from 1 to 500 mPa·s. From the standpoint of preventing contact faults, low molecular weight siloxane oligomers (octamethyltetrasiloxane (D4) and decamethylpentasiloxane (D5)) are preferably reduced or eliminated.

[(C) Hydrosilylation Reaction Catalyst]

The hydrosilylation reaction catalyst can be a platinum-based catalyst, a rhodium-based catalyst, and a palladium-based catalyst. A platinum-based catalyst is especially preferred because it promotes curing of the present composition to a remarkable degree. Examples of platinum-based catalysts include platinum fine powder, chloroplatinic acid, alcohol solutions of chloroplatinic acid, platinum-alkenylsiloxane complexes, platinum-olefin complexes, platinum-carbonyl complexes, and any of these platinum-based catalysts dispersed or encapsulated in a thermoplastic resin such as a silicone resin, polycarbonate resin, or acrylic resin. A platinum-alkenylsiloxane complex is especially preferred. Examples of alkenylsiloxane include 1,3-divinyl-1,1,3,3-tetramethyldisiloxane, 1,3,5,7-tetramethyl-1,3,5,7-tetravinylcyclotetrasiloxane, alkenyl siloxanes in which some of the methyl groups in the alkenyl siloxane have been substituted with, for example, ethyl groups or phenyl groups, and alkenyl siloxanes in which some of the vinyl groups in the alkenyl siloxane have been substituted with, for example, allyl groups or hexenyl groups. In particular, 1,3-divinyl-1,1,3,3-tetramethyldisiloxane is preferred because this platinum-alkenylsiloxane complex has good stability. Also, from the standpoint of improving the handling and workability and the pot life of the composition, a granular platinum-containing hydrosilylation reaction catalyst dispersed or encapsulated in a thermoplastic resin may be used. A non-platinum-based metal catalyst such as an iron, ruthenium, or iron/cobalt catalyst may be used to promote the hydrosilylation reaction.

The amount of hydrosilylation reaction catalyst added is a catalytic amount, preferably an amount with respect to component (A) such that the metal atoms are within a range from 0.01 to 500 ppm, from 0.01 to 100 ppm, or from 0.01 to 50 ppm by mass.

[(D) Functional Filler]

A curable organopolysiloxane composition of the present invention preferably contains (D) a functional filler. The functional filler is preferably at least one type selected from among reinforcing fillers, thermally conductive fillers, and conductive fillers. There are no particular restrictions on the particle size of a fine powder of these functional fillers, but the median diameter ("average particle size" below) as measured, for example, by a laser diffraction/scattering method is preferably in a range from 0.01 µm to 10 µm. Because a composition of the present invention is suitable for precision application in areas with a diameter of 1000 µm, a functional filler with a large particle size is preferably not included. The average particle size is either the average primary particle size or secondary particle size depending on the type of functional filler being used, but an average primary particle size within the aforementioned range is especially preferred for a reinforcing filler.

A reinforcing filler imparts mechanical strength to a silicone rubber cured product obtained by curing a composition of the present invention and improves performance as a protective agent or adhesive. Examples of reinforcing fillers include inorganic fillers such as fumed silica fine powder, precipitated silica fine powder, calcined silica fine powder, fumed titanium dioxide fine powder, quartz fine powder, calcium carbonate fine powder, diatomaceous earth fine powder, aluminum oxide fine powder, aluminum hydroxide fine powder, zinc oxide fine powder, zinc carbonate fine powder, and carbon black. These inorganic fillers may be inorganic fillers surface-treated with treatment agents including organoalkoxysilanes such as methyltrimethoxysilane, organohalosilanes such as trimethylchlorosilane, organosilazane such as hexamethyldisilazane, and siloxane oligomers such as dimethylsiloxane oligomers capped with a α,ω-silanol group, methylphenylsiloxane oligomers capped with a α,ω-silanol group, and methylvinyl siloxane oligomers capped with a α,ω-silanol group. Organopolysiloxanes with a low degree of polymerization and silanol groups at both ends of the molecular chain, preferably surface-treated dimethylsiloxanes capped with a α,ω-silanol group and having no functional groups other than the terminal silanol groups in the molecule, are preferred as component (D) as excellent initial adhesion, adhesion durability and adhesion strength can be realized at low temperatures in a short period of time, and a sufficient period of usability (storage period and handling period) can often be secured. From the standpoint of technical curing of the present invention, (D1) a reinforcing filler having a primary particle size within a range from 0.01 to 0.5 µm is preferred and a silica powder treated with an organosilazane and having a primary particle size within a range from 0.01 to 0.30 µm is especially preferred.

There are no particular restrictions on the amount of reinforcing filler used but an amount in a range from 0.1 to 20.0 parts by mass, in a range from 1.0 to 15.0 parts by mass, or in a range from 2.0 to 10.0 parts by mass, per 100 parts by mass organopolysiloxane, is especially preferred from the standpoint of improving the viscosity at a strain rate of 0.1 (1/s). From the standpoint of compounding component (D), some or all of component (D) may be kneaded together with component (A) before being added to the composition in the form of a master batch containing component (A) and surface treatment agent component (D).

A thermal conductive filler or conductive filler is a component that can be used to impart thermal conductivity or electrical conductivity to a silicone rubber cured product obtained by curing the composition if desired. Examples include fine metal powders of gold, silver, nickel, or copper; a fine powder of a ceramic, glass, quartz, or organic resin having a metal such as gold, silver, nickel, or copper deposited or plated on the surface; metal compounds such as aluminum oxide, aluminum nitride, or zinc oxide; and mixtures of two or more of these. Silver powder, aluminum powder, aluminum oxide powder, zinc oxide powder, aluminum nitride powder, or graphite is preferred. When electrical insulating properties are desired, the compound preferably contains a metal oxide powder or metal nitride powder and more preferably contains aluminum oxide powder, zinc oxide powder, or aluminum nitride powder.

[(E) Adhesion Promoter]

A composition of the present invention preferably contains (E) one or more type of adhesion promoter, and more preferably contains one or more type of adhesion promoter selected from among components (e1) to (e4) below. A composition containing these components has excellent initial adhesion to an unwashed aluminum die cast or resin material, improves adhesion durability and adhesion strength even when used in harsh environments, and can maintain the reliability and durability of electric and electronic components over a long period of time.

(e1) Reaction mixtures of amino group-containing organoalkoxysilanes and epoxy group-containing organoalkoxysilanes (e2) Organic compounds having at least two alkoxysilyl groups per molecule and containing a bond other than a silicon-oxygen bond between silyl groups (e3) Epoxy group-containing silanes or partially hydrolyzed condensates thereof represented by the general formula:

$$R^a{}_n Si(OR^b)_{4-n}$$

(where $R^a$ is a monovalent epoxy group-containing organic group, $R^b$ is an alkyl group having 1 to 6 carbon atoms or a hydrogen atom, and n is a number in a range from 1 to 3)

(e4) Reaction mixtures of vinyl group-containing siloxane oligomers (including those with a linear or cyclic structure) and epoxy group-containing trialkoxysilanes Component (e1) is a reaction mixture of an amino group-containing organoalkoxysilane and an epoxy group-containing organoalkoxysilane. Component (e1) is a component that imparts initial adhesion to various types of substrate making contact during the curing process, especially low-temperature adhesion to unwashed deposited material. This component may also act as a crosslinking agent in curing systems for curable compositions including this component as an adhesion promoter. Examples of reaction mixtures can be found in JP S52-008854 B2 and JP H10-195085 A.

Examples of alkoxysilanes having an amino group-containing organic group constituting component (e1) include aminomethyltriethoxysilane, 3-aminopropyltrimethoxysilane, 3-aminopropyltriethoxysilane, 3-aminopropylmethyldimethoxysilane, N-(2-aminoethyl) aminomethyltributoxysilane, N-(2-aminoethyl)-3-aminopropyltrimethoxysilane, N-(2-aminoethyl)-3-aminopropylmethyldimethoxysilane, and 3-anilinopropyltriethoxysilane.

Examples of epoxy group-containing organoalkoxysilanes include 3-glycidoxypropyltrimethoxysilane, 3-glycidoxypropylmethyldimethoxysilane, 2-(3,4-epoxycyclohexyl) ethyltrimethoxysilane, and 2-(3,4-epoxycyclohexyl) ethylmethyldimethoxysilane.

The molar ratio of amino group-containing organoalkoxysilane to epoxy group-containing organoalkoxysilane is preferably in a range from 1:1.5 to 1:5, and more preferably in a range from 1:2 to 1:4. Component (e1) can be readily synthesized by mixing together an alkoxysilane having an amino group-containing organic group and an alkoxysilane having an epoxy group-containing organic group mentioned above and reacting the mixture at room temperature or under heat.

Even more preferably, the present invention contains a carbasilatrane derivative represented by the general formula below obtained by performing cyclization by an alcohol exchange reaction while reacting an alkoxysilane having an amino group-containing organic group with an alkoxysilane having an epoxy group-containing organic group using the method described in JP H10-195085 A.

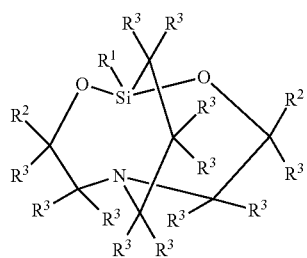

[Formula 2]

{In this formula, $R^1$ is an alkyl group or alkoxy group, each $R^2$ is the same or different group selected from among a set represented by the following formula

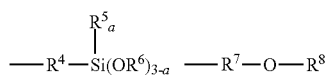

[Formula 3]

(where $R^4$ is an alkylene group or an alkyleneoxyalkylene group, $R^5$ is a monovalent hydrocarbon group, $R^6$ is an alkyl group, $R^7$ is an alkylene group, $R^8$ is an alkyl group, alkenyl group, or acyl group, and a is 0, 1 or 2), and each $R^3$ is the same or different hydrogen atom or alkyl group.} Examples of these carbasilatrane derivatives include silatrane derivatives having an alkenyl group and a silicon-bonded alkoxy group in a molecule represented by the following structure.

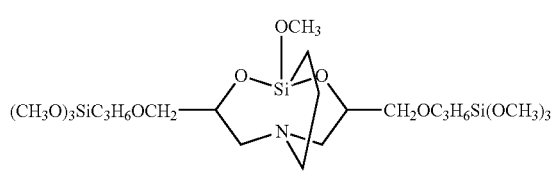

[Formula 4]

Component (e2) is an organic compound having at least two alkoxysilyl groups per molecule and a bond other than a silicon-oxygen bond between silyl groups, and is a component that improves initial adhesion when used alone and improves adhesion durability under harsh conditions in cured products containing this adhesion promoter when combined with component (e1) and component (e3).

Component (e2) is preferably a disilaalkane compound represented by the following formula.

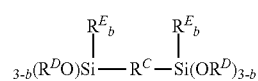

[Formula 5]

(In this formula, $R^C$ is a substituted or unsubstituted alkylene group having from 2 to 20 carbon atoms, each $R^D$ is independently an alkyl group or an alkoxyalkyl group, each $R^E$ is independently a monovalent hydrocarbon group, and each b is independently 0 or 1.) Component (e2) is available commercially in the form of various reagents and products, but can be synthesized if necessary using a method common in the art such as a Grignard reaction or hydrosilylation reaction. For example, it can be synthesized using a method common in the art in which a hydrosilylation reaction is conducted between a diene and a trialkoxysilane or organodialkoxysilane.

In the formula, $R^E$ is a monovalent hydrocarbon group, for example, an alkyl group such as a methyl group, an ethyl group or a propyl group, an alkenyl group such as a vinyl group or an allyl group, or an aryl group such as a phenyl group, preferably a lower alkyl group. $R^D$ is an alkyl group such as a methyl group, an ethyl group or a propyl group, or an alkoxyalkyl group such as a methoxyethyl group, preferably one having no more than 4 carbon atoms. $R^C$ is a substituted or unsubstituted alkylene group. A linear or branched alkylene group may be used without any restrictions, and a mixture of these may also be used. From the standpoint of improving adhesion, a linear and/or branched alkylene group having from 2 to 20 carbon atoms is preferred, but a linear and/or branched alkylene having from 5 to 10 carbon atoms, especially a hexylene having 6 carbon atoms, is preferred. The unsubstituted alkylene groups may be a butylene group, a pentylene group, a hexylene group, a heptylene group, an octylene group, a nonylene group, a decylene group, or a branched chain thereof, and the hydrogen atoms may be substituted with a methyl group, ethyl group, propyl group, butyl group, cyclopentyl group, cyclohexyl group, vinyl group, allyl group, 3,3,3-trifluoropropyl group, or 3-chloropropyl group.

Specific examples of component (e2) include bis (trimethoxysilyl) ethane, 1,2-bis (trimethoxysilyl) ethane, 1,2-bis (triethoxysilyl) ethane, 1,2-bis (methyldimethoxysilyl) ethane, 1,2-bis (methyldiethoxysilyl) ethane, 1,1-bis (trimethoxysilyl) ethane, 1,4-bis (trimethoxysilyl) butane, 1,4-bis (triethoxysilyl) butane, 1-methyldimethoxysilyl-4-trimethoxysilylbutane, 1-methyldiethoxysilyl-4-triethoxysilylbutane, 1,4-bis (methyldimethoxysilyl) butane, 1,4-bis (methyldiethoxysilyl) butane, 1,5-bis (trimethoxysilyl) pentane, 1,5-bis (triethoxysilyl) pentane, 1,4-bis (trimethoxysilyl) pentane, 1,4-bis (triethoxysilyl) pentane, 1-methyldimethoxysilyl-5-trimethoxysilylpentane, 1-methyldiethoxysilyl-5-triethoxysilylpentane, 1,5-bis (methyldimethoxysilyl) pentane, 1,5-bis (methyldiethoxysilyl) pentane, 1,6-bis (trimethoxysilyl) hexane, 1,6-bis (triethoxysilyl) hexane, 1,4-bis (trimethoxysilyl) hexane, 1,5-bis (trimethoxysilyl) hexane, 2,5-bis (trimethoxysilyl) hexane, 1-methyldimethoxysilyl-6-trimethoxysilylhexane, 1-phenyldiethoxysilyl-6-triethoxysilylhexane, 1,6-bis (methyldimethoxysilyl) hexane, 1,7-bis (trimethoxysilyl) heptane, 2,5-bis (trimethoxysilyl) heptane, 2,6-bis (trimethoxysilyl) heptane, 1,8-bis (trimethoxysilyl) octane, 2,5-bis (trimethoxysilyl) octane, 2,7-bis (trimethoxysilyl) octane, 1,9-bis (trimethoxysilyl) nonane, 2,7-bis (trimethoxysilyl) nonane, 1,10-bis (trimethoxysilyl) decane, and 3,8-bis (trimethoxysilyl) decane. These may be used alone or in mixtures of two or more. In the present invention, 1,6-bis (trimethoxysilyl) hexane, 1,6-bis (triethoxysilyl) hexane, 1,4-bis (trimethoxysilyl) hexane, 1,5-bis (trimethoxysilyl) hexane, 2,5-bis (trimethoxysilyl) hexane, 1-methyldimethoxysilyl-6-trimethoxysilylhexane, 1-phenyldiethoxysilyl-6-triethoxysilylhexane, and 1,6-bis (methyldimethoxysilyl) hexane are preferred.

Component (e3) is an epoxy group-containing silane or partially hydrolyzed condensate thereof represented by the following formula.

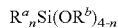

(In this formula, $R^a$ is a monovalent epoxy group-containing organic group, $R^b$ is an alkyl group having from 1 to 6 carbon atoms or a hydrogen atom, and n is a number in a range from 1 to 3.) This is a component that improves initial adhesion when used alone and improves adhesion durability under harsh conditions such as immersion in salt water in cured products containing this adhesion promoter when combined with component (e1) and component (e2). Component (e3) is a constituent component with component (e1), but must be present in the reaction product with component (e1) (typically a carbasilatrane derivative that is a cyclized reaction product) at a molar ratio in a predetermined range from the standpoint of realizing the technical effects of the present invention, and component (e1) must be added as a separate component.

Examples of epoxy group-containing silanes include 3-glycidoxyprolyltrimethoxysilane, 3-glycidoxypropylmethyldimethoxysilane, 2-(3,4-epoxycyclohexyl) ethyltrimethoxysilane, and 2-(3,4-epoxycyclohexyl) ethylmethyldimethoxysilane.

Component (e4) is an adhesion promoter having an epoxysiloxy unit represented by $R^1SiO_{3/2}$ (where $R^1$ is an epoxy group) and a vinylsiloxy unit. This component is described in JP H01-085224 A. This adhesive promoter can be obtained by subjecting an epoxy group-containing trialkoxysilane such as 3-glycidoxyprolyltrimethoxysilane and a linear vinyl group-containing siloxane oligomer capped at both ends of the molecular chain with a hydroxyl group (silanol group) or a cyclic vinyl group-containing siloxane oligomer such as tetramethyltetravinyl cyclotetrasiloxane to a hydrolysis reaction in the presence of an alkali compound (see the patent document mentioned above).

There are no particular restrictions on the amount of (E) adhesion promoter that is added, but the mass of the (E) adhesion promoter, which is the sum of components (e1) to (e4), may be in a range from 0.1 to 20% by mass of the curable organopolysiloxane composition, preferably from 0.3 to 10% by mass and more preferably from 0.5 to 5.0% by mass.

[(F) Hydrosilylation Reaction Inhibitor]

From the standpoint of handling and workability, a composition of the present invention preferably contains a hydrosilylation reaction inhibitor. A hydrosilylation reaction inhibitor is a component for inhibiting a hydrosilylation reaction in a composition of the present invention. Specific examples include acetylene-based (such as ethynyl cyclohexanol), amine-based, carboxylate-based, and phosphite-based reaction inhibitors. The amount of reaction inhibitor added is usually from 0.001 to 5% by mass of the overall silicone composition. Although there are no particular restrictions, acetylene-based compounds such as 3-methyl-1-butyn-3-ol, 3,5-dimethyl-1-hexyn-3-ol and 3-phenyl-1-butyn-3-ol; enyne-based compounds such as 3-methyl-3-penten-1-yne and 3,5-dimethyl-3-hexen-1-yne; cycloalkenyl siloxanes such as 1,3,5,7-tetramethyl-1,3,5,7-tetravinylcyclotetrasiloxane and 1,3,5,7-tetramethyl-1,3,5,7-tetrahexenylcyclotetrasiloxane; and triazole compounds such as benzotriazole can be used to improve the handling and workability of the silicone composition.

A curable organopolysiloxane composition of the present invention is suitable for precise application from nozzles with a diameter of 1000 μm or less in a microdroplet application device such as a jet dispenser. From the standpoint of controlling the curing reaction under high shear conditions and preventing the clogging of nozzles, component (F) may be a mixture of (F1) an acetylene-based hydrosilylation inhibitor and (F2) a cycloalkenylsiloxane-based hydrosilylation reaction inhibitor. A combination of ethynyl cyclohexanol and 1,3,5,7-tetramethyl-1,3,5,7-tetravinylcyclotetrasiloxane and/or 1,3,5,7-tetramethyl-1,3,5,7-tetrahexenylcyclotetrasiloxane is especially preferred.

[(G) Heat Resistance Imparting Agent]

A composition of the present invention includes components (A) to (F) and optionally another crosslinking agent and a hydrosilylation reaction inhibitor. From the standpoint of improving the heat resistance of a curable organopolysiloxane composition and cured product thereof, the present invention preferably also contains (G) a heat resistance imparting agent. There are no particular restrictions on component (G) as long as it can impart heat resistance to a composition of the present invention and cured product thereof. Examples include metal oxides such as iron oxide, titanium oxide, cerium oxide, magnesium oxide, and zinc oxide, metal hydroxides such as cerium hydroxide, phthalocyanine compounds, cerium silanolate, cerium fatty acid salts, and reaction products of organopolysiloxanes with carboxylate salts of cerium. Especially preferred is a phthalocyanine compound. Examples include the additives selected from the group consisting of metal-free phthalocyanine compounds and metal-containing phthalocyanine compounds disclosed in JP 2014-503680 A. Among the metal-containing phthalocyanine compounds, copper phthalocyanine compounds are especially preferred. An example of a most suitable and non-limiting heat-resistance imparting agent is 29H,31H-phthalocyaninato (2-)-N29, N30, N31, N32 copper. These phthalocyanine compounds are available commercially, such as Stan-Tone™ 40SP03 from PolyOne Corporation (Avon Lake, Ohio, USA).

The amount of component (G) may be in a range from 0.01 to 5.0% by mass, from 0.05 to 0.2% by mass, and from 0.07 to 0.1% by mass of the composition as a whole.

[Other Additives]

In addition to the components mentioned above, a curable organopolysiloxane composition of the present invention may contain optional components as long as the object of the present invention is not impaired. Optional components include crosslinking components, which can be trifunctional alkoxysilanes such as methyltrimethoxysilane, methyltriethoxysilane, ethyltrimethoxysilane, ethyltriethoxysilane, vinyltrimethoxysilane and phenyltrimethoxysilane; tetrafunctional silanes such as tetramethoxysilane and tetraethoxysilane; and partially hydrolyzed condensates thereof. Others include organic solvents such as toluene, xylene, acetone, methyl ethyl ketone, methyl isobutyl ketone, hexane and heptane, organopolysiloxanes free of silicon-bonded hydrogen atoms and silicon-bonded alkenyl groups, cold resistance-imparting agents, flame retardants, pigments, and dyes. If desired, a curable organopolysiloxane composition of the present invention can also contain other adhesion-imparting agents, one or more antistatic agents such as cationic surfactants, anionic surfactants, or nonionic surfactants; dielectric fillers; electrically conductive fillers; releasable components; thixotropic agents; and fungicides common in the art.

[Composition Production Method]

A curable organopolysiloxane composition of the present invention can be prepared by uniformly mixing together the components described above. For example, some of component (A) and component (D) can be mixed together beforehand to form a master batch, and then the rest of component (A) to component (C), component (E), component (F), and optionally component (G) may be mixed in. There are no restrictions on the order in which the components of the composition may be added in the production process.

Any mixing method common in the art can be used without restriction. However, use of a mixing device is preferred because a uniform mixture can be obtained by simple stirring. There are no particular restrictions on the mixing device, which can be a single-shaft or twin-shaft continuous mixer, a two-roll mixer, a Ross mixer, a Hobart mixer, a dental mixer, a planetary mixer, a kneader mixer, or a Henschel mixer.

[Form and Packaging of the Composition]

A curable organopolysiloxane composition of the present invention is preferably used as a one-component (one-part) composition. All of the components constituting the composition are placed in a single storage container and used with a microdroplet application device such as a jet dispenser. The packaging can be selected as desired based on the curing method, application means, and application target.

[Application in Electronic Components or Precursors Thereof]

The electronic component or precursor thereof may be any semiconductor device or precursor thereof, such as a diode, transistor, thyristor, monolithic IC, hybrid IC, LSI or VLSI, especially a MEMS device or precursor thereof. A MEMS device is a general term for a semiconductor device formed using the semiconductor microfabrication technologies referred to as microelectromechanical systems, and may be an image display device or an inertial sensor such as an acceleration sensor or an angular velocity sensor having a MEMS chip. A precursor of a semiconductor device is a general term for an unfinished electronic component prior to completion of the semiconductor device through wiring and chip arrangement and die bonding of chips using, for example, heating. This includes electronic components that are shipped or imported/exported prior to completion by wiring and mounting chips.

A curable organopolysiloxane composition of the present invention is applied to a semiconductor substrate. The semiconductor substrate may be a substantially flat or solid substrate with protrusions and unevenness due to the arrangement of circuitry. There are no particular restrictions on the material that is used, which may be a metal such as aluminum, iron, zinc, copper or a magnesium alloy, a ceramic, a plastic such as an epoxy resin, polyimide resin, phenol resin, bakelite resin, melamine resin, glass fiber-reinforced epoxy resin, acrylic resin, ABS or SPS, or glass. There are no particular restrictions on the thickness of the substrate, which may be from 0.1 to 10 mm.

[Application Method]

There are no particular restrictions on the methods used to apply the curable organopolysiloxane composition, but it is preferably applied on a substrate described above using a microdroplet application device in order to make full use of the advantages of the present invention. In an electronic component or precursor thereof in the present invention, the curable organopolysiloxane composition may be applied in at least some areas, and these applied areas preferably form a pattern described above.

A microdroplet application device that can be used in the present invention uses the inkjet application method or the dispenser application method. However, a curable organopolysiloxane composition of the present invention is preferably applied by a microdroplet application device using the dispenser application method. The dispenser application method can use an air, valve, screw, volume, or jet dispenser. However, a jet dispenser is preferred from the standpoint of micropattern application. Jet dispensers include air valve, solenoid, and piezo type devices. However, a piezo type device is preferred from the standpoint of micropattern application. The size and one-shot weight of droplets of curable organopolysiloxane composition jetted using a microdroplet discharge device can be designed based on selection of the microdroplet application device and jetting conditions. However, the droplet weight can be 50 µg or less, or 30 µg or less, or 25 µg or less, and can be an even smaller 10 µg droplet weight depending on the device.

The amount of curable components applied and the landing spot of the curable components of the droplets can be controlled with precision by using a microdroplet application device to form a highly precise pattern (of the cured product of the curable organopolysiloxane composition).

These microdroplet application devices are usually equipped with nozzles to jet a composition in droplet form. There are no particular restrictions on the application nozzle diameter, but the nozzle diameter must be 1000 µm or less, preferably from 50 to 200 µm and more preferably from 100 to 150 µm in order to apply dots with precision. In order to improve the fluidity of a curable organopolysiloxane composition of the present invention in the high shear range, droplets can be applied stably if the application nozzle diameter is 50 µm or more. If the application nozzle diameter is 200 µm or less, a large number of droplets can be applied in a short period of time. Because the fluidity declines sharply immediately after jetting and the viscosity of the droplets rises, precision application can be performed.

There are no particular restrictions on the dispensing frequency but 1 ms/shot to 10 s/shot is preferred and 1 ms/shot to 10 ms/shot is especially preferred. There are no particular restrictions on the nozzle traveling speed, but 1 to 300 mm/sec is preferred and 50 to 100 mm/sec is especially preferred. The dispensing frequency and the nozzle traveling speed can be set based on the device used and the intended use.

[Shape of Application Areas and Pattern Formation]

The curable organopolysiloxane composition of the present invention can form a pattern containing dot-shaped or linear application areas on a substrate using a microdroplet application device.

Each application area constituting the pattern is dot-like or linear. Because these are micro areas, the application areas preferably fit within a frame having a length and width of 1000 µm (especially a substantially circular area that fits within a frame with a diameter of 1000 µm or less) or form linear application areas having a line width of 1000 µm or less. Because a curable organopolysiloxane composition of the present invention can be applied to the formation of a precise pattern, the pattern formed by selecting a microdroplet application device or jetting conditions may consist of substantially circular application areas that fit within a frame with a diameter of 800 µm or less, linear application areas having a line width of 800 µm or less, or a combination of these. It can also be designed so that the pattern consists of substantially circular application areas that fit within a frame with a diameter of from 5 to 500 µm, linear application areas having a line width of from 5 to 500 µm or less, or a combination of these. Two or more of these micro application areas preferably constitute a pattern on the same substrate, and a pattern may be formed by distributing a plurality of these application areas on a substrate at a predetermined interval. The interval between application areas can be established freely but may be an interval of 5.0 mm or less or may be an interval in a range from 0.5 to 4.5 mm.

Each application area constituting a pattern is formed by droplets jetted from a microdroplet application device. There are no particular restrictions on the thickness, which can be set depending on the type of microdroplet device being used, such as a jet dispenser, and the intended use. The application thickness per droplet (shot) may be in a range from 1 to 1000 µm, but is preferably from 1 to 500 µm and more preferably from 1 to 300 µm.

Because a curable organopolysiloxane composition of the present invention behaves so that the fluidity declines sharply after jetting and the viscosity of the jetted droplets rises, scattering and overflowing (spreading) of the droplets is much less likely even when multiple layers are applied with precision in the same application area. As a result, it is easier to adjust the application thickness of the composition using multiple layers. For example, spots in which multiple layers of curable organopolysiloxane composition are applied in layers by continuous shots in dot-like application areas (to appear as physically raised application areas) can be formed with precision.

A curable organopolysiloxane composition applied in these areas is cured using means such as heating to form a cured product. The curable organopolysiloxane composition and cured product can be applied for any purpose, but is preferably applied for at least one type selected from among protecting, sealing or coating an electronic component or precursor in a semiconductor device. For example, specific applications include protecting semiconductor chips, electrodes or wiring, sealing semiconductor chips or electrodes, sealing spaces and gaps between electronic components, and coating any of these elements. It is preferably used to provide protection, sealing or coating using a micropattern. A micropattern of the curable organopolysiloxane composition on a substrate can be applied industrially, for example, to electronic components, image display devices, and MEMS devices.

[Curing Properties]

A curable organopolysiloxane composition of the present invention is preferably cure using a hydrosilylation reaction to form an organopolysiloxane cured product. There are no particular restrictions on the temperature conditions used to cure a hydrosilylation reaction-curable silicone composition, but the temperature is usually in a range from 20° C. to 200° C. and more preferably in a range from 20° C. to 180° C. Because curing can be performed if desired at a high temperature in a short period of time to readily form a cured product in a short period of time, the composition can be used to improve the yield and manufacturing efficiency in the industrial production of electronic components, image display devices, and MEMS devices. There are no particular restrictions, but the composition can be cured over a longer period of time (such as several hours to several days) at a low temperature such as room temperature.

[Electronic Components or Precursors Thereof]

An electronic component or precursor thereof of the present invention can be obtained using a method for manufacturing an electronic component or precursor thereof, the method comprising at least a step of applying this curable organopolysiloxane composition on a semiconductor substrate using a microdroplet application device. The application conditions and application areas were described above. In particular, the application area for the curable organopolysiloxane composition is preferably a substantially circular area fitting within a frame having a diameter of 500 µm or less, a linear area having a line width of 500 µm or less, or a pattern composed of a combination of these areas, and the microdroplet application device is preferably a jet dispenser having jet ports with a nozzle diameter of from 50 to 200 µm. In addition to this step, a method for manufacturing an electronic component or a precursor thereof in the present invention may include, if desired, a wafer protective film forming step, a semiconductor substrate wiring step, a chip and electrode connecting step, a polishing step, and a sealing step for some or all of the components performed on any timing desired.

Specific Examples of Electric and Electronic Devices

The electronic component or precursor thereof may be any semiconductor device or precursor thereof, such as a diode, transistor, thyristor, monolithic IC, hybrid IC, LSI or VLSI, especially a MEMS device or precursor thereof. A MEMS device is a general term for a semiconductor device formed using the semiconductor microfabrication technologies referred to as microelectromechanical systems, and may be an inertial sensor such as acceleration sensor or angular velocity sensor, a magnetic sensor, a pressure sensor, a microphone, an environmental sensor for gas, humidity or particles, or an image sensor having a MEMS chip, or may be an actuator such as an optical actuator for auto focus or micro mirrors, a wireless communication component, a micro speaker, or an image display device using MEMS technology. A precursor of a semiconductor device is a general term for an unfinished electronic component prior to completion of the semiconductor device through wiring and chip arrangement and die bonding of chips using, for example, heating. This includes electronic components that are shipped or imported/exported prior to completion by wiring and mounting chips.

Examples

The following is a more detailed description of the present invention with reference to examples. However, the present invention is not limited by these examples. The following compounds and compositions were used in Example 1 and Comparative Examples 1-3.

<Components in Curable Organopolysiloxane Compositions>

A1: Linear polydimethylsiloxane capped at both ends with a dimethylvinyl group having a viscosity at 20° C. of 60 mPa·s A2: Linear polydimethylsiloxane capped at both ends with a dimethylvinyl group having a viscosity at 20° C. of 400 mPa·s A3: Linear polydimethylsiloxane capped at both ends with a dimethylvinyl group having a viscosity at 20° C. of 2,000 mPa·s A4: Linear polydimethylsiloxane capped at both ends with a dimethylvinyl group having a viscosity at 20° C. of 10,000 mPa·s B1: Methyl hydrogen siloxane/dimethyl siloxane copolymer capped at both ends with a trimethylsiloxy group containing a silicon-bonded hydrogen content of 0.7% by weight and having a viscosity at 20° C. of 60 mPa·s C1: Complex of platinum and 1,3-divinyl-1,1,3,3-tetramethyldisiloxane with a platinum concentration of 0.6% by weight D1: A master batch of 80% by weight of component A3 above and 20% by weight of silazane-treated dry silica (average primary particle size as measured by laser diffraction/scattering method: 0.1-0.2 μm)

E1: 1:1 mass ratio condensation reaction product of methyl vinyl siloxane oligomer capped at both ends with a hydroxyl group having a viscosity of 30 mPa·s and 3-glycidoxypropyltrimethoxysilane F1: Ethynyl cyclohexanol F2: 1,3,5,7-tetramethyl-1,3,5,7-tetravinylcyclotetrasiloxane

[Preparation of Curable Organopolysiloxane Compositions]

All of the components except for component (C1) were uniformly mixed together at the weight ratios (parts by weight) shown in Table 1, component (C1) was mixed in at the weight ratio (parts by weight) shown in Table 1, and a Musashi Engineering 10 cc syringe was filled after vacuum degassing to obtain the compositions in Example 1 and Comparative Examples 1-3.

TABLE 1

|  | Example 1 | Comparative Example 1 | Comparative Example 2 | Comparative Example 3 |
|---|---|---|---|---|
| A1 | 18.0 | | | |
| A2 | 49.6 | 82.1 | | |
| A3 | | | 54.7 | |
| A4 | | 20.0 | | 76.2 |
| B1 | 7.5 | 6.0 | 4.4 | 3.9 |
| C1 | 0.2 | 0.2 | 0.2 | 0.2 |
| D1 | 23.0 | 10.0 | 19.0 | 18.0 |
| E1 | 1.0 | 1.0 | 1.0 | 1.0 |
| F1 | 0.20 | 0.20 | 0.20 | 0.20 |
| F2 | 0.5 | 0.5 | 0.5 | 0.5 |
| Total nos. of parts | 100 | 100 | 100 | 100 |
| SiH/Vi mol ratio | 1.70 | 1.66 | 1.69 | 1.67 |
| Viscosity (Pa·s) | | | | |
| at 0.1/s | 109 | 12 | 107 | 104 |
| at 10/s | 3.2 | 1.1 | 8.4 | 12.3 |
| at 1000/s | 0.65 | 0.54 | 3.68 | 9.24 |

TABLE 1-continued

|  | Example 1 | Comparative Example 1 | Comparative Example 2 | Comparative Example 3 |
|---|---|---|---|---|
| Thixo rate | | | | |
| 0.1/1000 | 167.7 | 22.2 | 29.1 | 11.3 |

* Includes component A3 derived from the master batch for component D1

Silicon Chip Manufacturing Test Using the Example, Etc

Silicon chips serving as an electronic component or precursor thereof of the present invention were manufactured by applying the curable organopolysiloxane compositions in Example 1 and Comparative Examples 1-3.

[Viscosity]

The viscosity (Pa·s) at 25° C. of the composition was measured using an MCR-102 rheometer from Anton Paar. Using a 2-degree cone with a 20 mm diameter for the geometry, pre-shear was conducted for 60 s at 10 (1/s), the equilibration time (stop time after pre-shear) was 60 s, and the rate of increase in the strain rate was measured at 120 s/decade from a shear rate of 0.05 (1/s) to a shear rate of 5000 (1/s). The measured viscosity for each composition is shown in Table 1.

[Jet Dispensing Test]

In the application test performed on each composition using a jet dispenser, an 8×8 dot pattern was applied at 1.4 mm intervals on a 20 mm×20 mm silicon chip substrate using a device from Musashi Engineering with the configuration shown in Table 2.

TABLE 2

| Dispensing Table | Shot Master 300DS-S |
|---|---|
| Controller | Jet Master 3 |
| Dispensing Head | Aero Jet MJET-A |
| Valve Seat | V |
| Nozzle | 36G |

The other test conditions such as the valve release time (on time, 2 msec minimum), the interval between shots (off time, maximum for dot application), the traveling distance (stroke) once the rod has been released, the syringe back pressure for the silicone composition (syringe pneumatic pressure), and the distance from the jet nozzle to the substrate (substrate distance) were adjusted, and the average application diameter and the average weight per shot after 200 shots under stable conditions for the minimum amount of jetting are shown in Table 3.

TABLE 3

|  | Viscosity/Pa·s | | | Shot Conditions | | | | | Results | |
|---|---|---|---|---|---|---|---|---|---|---|
|  | 0.1/s | 1000/s | 0.1/1000 | On time (msec) | Off time (msec) | Stroke (mm) | Cylinder Pressure (MPa) | Substrate Distance (mm) | Avg. Coating Dia. (um) | Avg. Shot Wt. (μg) |
| Ex-1 | 109 | 0.65 | 167.7 | 2.0 | 99.99 | 0.100 | 0.03 | 0.7 | 753 | 23.5 |
| C Ex-1 | 12 | 0.54 | 22.2 | 2.0 | 99.99 | 0.130 | 0.01 | 0.7 | 1336 | 18.0 |
| C Ex-2 | 107 | 3.68 | 29.1 | 2.0 | 99.99 | 0.700 | 0.01 | 0.7 | 914 | 31.0 |
| C Ex-3 | 104 | 9.24 | 11.3 | 2.0 | 99.99 | 0.1-1.0 | 0.01-0.10 | 0.7 | Shots Impossible | |

SUMMARY

As shown in Table 1, the composition in Example 1 was a curable silicone composition that could be controlled for a sufficiently low viscosity of 2.0 Pa·s or less (=0.65 Pa·s) at a strain rate of 1,000 (1/s), low fluidity and a viscosity of 109 Pa·s at a strain rate of 0.1 (1/s), and a viscosity at a strain rate of 0.1 (1/s) of at least 50.0 times the viscosity at a strain rate of 1,000 (1/s) (=167.7). The curable silicone composition in Example 1, as shown in Table 3 and FIG. 1, could be applied with precision in a range with an average application diameter of 753 μm using a jet dispenser as the microdroplet application device, and a silicon chip with a micropattern could be created.

The compositions in Comparative Examples 1-3 which did not satisfy these characteristics could not be applied using a jet dispenser as the microdroplet application device or the average application diameter was larger and the precision application properties poorer than the example. More specifically, Comparative Example 1, which had a sufficiently low viscosity of 0.54 Pa·s at a strain rate of 1,000 (1/s), could be jetted in small amounts at a shot weight of 18 μg, but the average application diameter after landing was 1336 um because the viscosity at a strain rate of 0.1 (1/s) was 12 Pa·s and fine application could not be performed. Comparative Example 2, which had a viscosity of 3.68 Pa·s at a strain rate of 1,000 (1/s), could not be applied in small amounts at a shot weight of 31 μg. Comparative Example 4, which had a viscosity of 9.24 Pa·s at a strain rate of 1,000 (1/s), could not be stably jetted. In other words, unlike Example 1, a silicon chip with a micropattern could not be created.

The invention claimed is:

1. An electronic component or precursor thereof, comprising a curable organopolysiloxane composition or a cured product thereof, the curable organopolysiloxane composition having:
   i) a viscosity of no more than 2.0 Pa·s at a strain rate of 1,000 (1/s); and
   ii) a viscosity at a strain rate of 0.1 (1/s) of no less than 50.0 times the viscosity at a strain rate of 1,000 (1/s);
   wherein the curable organopolysiloxane composition comprises:
   (A) an alkenyl group-containing organopolysiloxane having a viscosity at 25° C. of from 10 to 100,000 mPa·s in an amount of 100 parts by mass;
   (B) an organohydrogenpolysiloxane in an amount such that there are from 0.2 to 50 mol silicon-bonded hydrogen atoms in component (B) per mol of alkenyl groups in component (A);
   (C) a hydrosilylation reaction catalyst in a catalytic amount;
   (D) a functional filler with an average particle size of from 0.01 to 10 μm as measured by a laser diffraction/scattering method in an amount of from 2.5 to 20.0 parts by mass;
   (E) an adhesion promoter; and
   (F) a hydrosilylation reaction inhibitor.

2. The electronic component or precursor thereof according to claim 1, wherein an application area for the curable organopolysiloxane composition or cured product thereof is a substantially circular area fitting within a frame having a diameter of 1000 μm or less, a linear area having a line width of 1000 μm or less, or a pattern composed of a combination of these areas.

3. The electronic component or precursor thereof according to claim 2, wherein the application area for the curable organopolysiloxane composition or cured product thereof is an application area for application via a jet dispenser.

4. The electronic component or precursor thereof according to claim 3, wherein the jet dispenser has jet ports with a nozzle diameter of from 50 to 200 μm.

5. The electronic component or precursor thereof according to claim 2, wherein the application area for the curable organopolysiloxane composition or cured product thereof is formed for one or more purposes selected from among protecting, sealing or coating an electronic component or precursor thereof.

6. The electronic component or precursor thereof according to claim 1, wherein the electronic component is a semiconductor device.

7. The electronic component or precursor thereof according to claim 1, wherein the electronic component is a microelectromechanical systems (MEMS) device.

8. A method for manufacturing an electronic component or precursor thereof, the method comprising applying a curable organopolysiloxane composition on a semiconductor substrate using a microdroplet application device, the curable organopolysiloxane composition having:
   i) a viscosity of no more than 2.0 Pa·s at a strain rate of 1,000 (1/s); and
   ii) a viscosity at a strain rate of 0.1 (1/s) of no less than 50.0 times the viscosity at a strain rate of 1,000 (1/s);
   wherein the curable organopolysiloxane composition comprises:
   (A) an alkenyl group-containing organopolysiloxane having a viscosity at 25° C. of from 10 to 100,000 mPa·s in an amount of 100 parts by mass;
   (B) an organohydrogenpolysiloxane in an amount such that there are from 0.2 to 50 mol silicon-bonded hydrogen atoms in component (B) per mol of alkenyl groups in component (A);
   (C) a hydrosilylation reaction catalyst in a catalytic amount;
   (D) a functional filler with an average particle size of from 0.01 to 10 μm as measured by a laser diffraction/scattering method in an amount of from 2.5 to 20.0 parts by mass;
   (E) an adhesion promoter; and
   (F) a hydrosilylation reaction inhibitor.

9. The method for manufacturing an electronic component or precursor thereof according to claim 8, wherein an application area for the curable organopolysiloxane composition using the microdroplet application device is a substantially circular area fitting within a frame having a diameter of 1000 μm or less, a linear area having a line width of 1000 μm or less, or a pattern composed of a combination of these areas.

10. The method for manufacturing an electronic component or precursor thereof according to claim 8, wherein the microdroplet application device is a jet dispenser having jet ports with a nozzle diameter of from 50 to 200 μm.

* * * * *